United States Patent
Chu et al.

(10) Patent No.: US 9,859,901 B1
(45) Date of Patent: Jan. 2, 2018

(54) BUFFER WITH PROGRAMMABLE INPUT/OUTPUT PHASE RELATIONSHIP

(71) Applicant: Integrated Device Technology, Inc., San Jose, CA (US)

(72) Inventors: Min Chu, Milpitas, CA (US); John C. Hsu, Sunnyvale, CA (US); Ron D. Wade, Los Gatos, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 61 days.

(21) Appl. No.: 15/064,369

(22) Filed: Mar. 8, 2016

(51) Int. Cl.
*H03L 7/06* (2006.01)
*H03L 7/081* (2006.01)
*H03L 7/091* (2006.01)

(52) U.S. Cl.
CPC ............ *H03L 7/0814* (2013.01); *H03L 7/091* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 4,684,941 A | 8/1987 | Smith et al. | |
| 4,862,485 A | 8/1989 | Guinea et al. | |
| 5,663,105 A | 9/1997 | Yu et al. | |
| 5,748,949 A | 5/1998 | Johnston et al. | |
| 5,757,240 A | 5/1998 | Boerstler et al. | |
| 5,848,355 A | 12/1998 | Rasor et al. | |
| 5,903,195 A | 5/1999 | Lukes et al. | |
| 6,219,797 B1 | 4/2001 | Liu et al. | |
| 6,259,327 B1 | 7/2001 | Balistreri et al. | |
| 6,640,311 B1 | 10/2003 | Knowles et al. | |
| 6,643,787 B1 | 11/2003 | Zerbe et al. | |
| 6,650,193 B2 | 11/2003 | Endo et al. | |
| 6,683,506 B2 | 1/2004 | Ye et al. | |
| 6,727,767 B2 | 4/2004 | Takada et al. | |
| 6,768,387 B1 | 7/2004 | Masuda et al. | |
| 6,870,411 B2 | 3/2005 | Shibahara et al. | |
| 6,959,066 B2 | 10/2005 | Wang et al. | |
| 7,012,476 B2 | 3/2006 | Ogiso et al. | |

(Continued)

OTHER PUBLICATIONS

"19-Output PCIE Gen 3 Buffer", Si53019-A01A, Silicon Laboratories Inc., Rev. 1.1 May 2015, 34 Pages.

(Continued)

*Primary Examiner* — Adam Houston
(74) *Attorney, Agent, or Firm* — Glass & Associates; Kenneth Glass; William D. Davis (57) ABSTRACT

An apparatus includes a phase locked loop circuit having a phase comparator for generating a signal indicative of a phase difference between a signal presented to a first input of the phase comparator and a signal presented to a second input of the phase comparator. The apparatus includes at least one delay element disposed so as to enable contributing at least one of the following:
  i) delay to a signal provided to the first input of the phase comparator;
  ii) delay to a signal provided to the second input of the phase comparator.
A delay contributed by the at least one delay element varies in accordance with an associated delay control value. The phase locked loop circuit and the at least one delay element reside on a same semiconductor substrate.

13 Claims, 10 Drawing Sheets

(56) References Cited

U.S. PATENT DOCUMENTS

| | | |
|---|---|---|
| 7,323,916 B1 | 1/2008 | Sidiropoulos et al. |
| 7,405,594 B1 | 7/2008 | Xu et al. |
| 7,434,083 B1 | 10/2008 | Wilson et al. |
| 7,541,848 B1 | 6/2009 | Masuda et al. |
| 7,545,188 B1 | 6/2009 | Xu et al. |
| 7,573,303 B1 | 8/2009 | Chi et al. |
| 7,586,347 B1 | 9/2009 | Ren et al. |
| 7,590,163 B1 | 9/2009 | Miller et al. |
| 7,671,635 B2 | 3/2010 | Fan et al. |
| 7,737,739 B1 | 6/2010 | Bi et al. |
| 7,741,981 B1 | 6/2010 | Wan et al. |
| 7,750,618 B1 | 7/2010 | Fang et al. |
| 7,786,763 B1 | 8/2010 | Bal et al. |
| 7,800,422 B2 | 9/2010 | Lee et al. |
| 7,816,959 B1 | 10/2010 | Isik et al. |
| 7,907,625 B1 | 3/2011 | MacAdam et al. |
| 7,928,880 B2 | 4/2011 | Tsukamoto |
| 7,941,723 B1 | 5/2011 | Lien et al. |
| 8,010,072 B1 | 8/2011 | Nathawad |
| 8,018,289 B1 | 9/2011 | Hu et al. |
| 8,164,367 B1 | 4/2012 | Bal et al. |
| 8,179,952 B2 | 5/2012 | Thurston et al. |
| 8,188,796 B2 | 5/2012 | Zhu et al. |
| 8,259,888 B2 | 9/2012 | Hua et al. |
| 8,284,816 B1 | 10/2012 | Clementi et al. |
| 8,305,154 B1 | 11/2012 | Kubena et al. |
| 8,416,107 B1 | 4/2013 | Wan et al. |
| 8,432,231 B2 | 4/2013 | Nelson et al. |
| 8,436,677 B2 | 5/2013 | Kull et al. |
| 8,456,155 B2 | 6/2013 | Tamura et al. |
| 8,471,751 B2 | 6/2013 | Wang |
| 8,537,952 B1 | 9/2013 | Arora et al. |
| 8,693,557 B1 | 4/2014 | Zhang et al. |
| 8,704,564 B2 | 4/2014 | Hasegawa et al. |
| 8,723,573 B1 | 5/2014 | Wang et al. |
| 8,791,763 B2 | 7/2014 | Taghivand |
| 8,896,476 B2 | 11/2014 | Harpe |
| 8,933,830 B1 | 1/2015 | Jeon |
| 8,981,858 B1 | 3/2015 | Grivna et al. |
| 9,077,386 B1 | 7/2015 | Holden et al. |
| 9,100,232 B1 | 8/2015 | Hormati et al. |
| 9,455,854 B2 | 9/2016 | Gao |
| 2002/0079937 A1 | 6/2002 | Xanthopoulos et al. |
| 2002/0191727 A1 | 12/2002 | Staszewski et al. |
| 2003/0042985 A1 | 3/2003 | Shibahara et al. |
| 2003/0184350 A1 | 10/2003 | Wang et al. |
| 2004/0136440 A1 | 7/2004 | Miyata et al. |
| 2004/0165691 A1 | 8/2004 | Rana et al. |
| 2005/0170787 A1 | 8/2005 | Yamamoto et al. |
| 2006/0103436 A1 | 5/2006 | Saitou et al. |
| 2006/0119402 A1 | 6/2006 | Thomsen et al. |
| 2006/0197614 A1 | 9/2006 | Roubadia et al. |
| 2006/0290391 A1 | 12/2006 | Leung et al. |
| 2007/0149144 A1 | 6/2007 | Beyer et al. |
| 2007/0247248 A1 | 10/2007 | Kobayashi et al. |
| 2008/0043893 A1 | 2/2008 | Nagaraj et al. |
| 2008/0104435 A1 | 5/2008 | Pernia et al. |
| 2008/0129351 A1 | 6/2008 | Chawla et al. |
| 2008/0246546 A1 | 10/2008 | Ha et al. |
| 2009/0083567 A1 | 3/2009 | Kim et al. |
| 2009/0140896 A1 | 6/2009 | Adduci et al. |
| 2009/0153252 A1 | 6/2009 | Chen et al. |
| 2009/0184857 A1 | 7/2009 | Furuta et al. |
| 2009/0231901 A1 | 9/2009 | Kim et al. |
| 2009/0256601 A1 | 10/2009 | Zhang et al. |
| 2009/0262567 A1 | 10/2009 | Shin et al. |
| 2010/0007427 A1 | 1/2010 | Tomita et al. |
| 2010/0052798 A1 | 3/2010 | Hirai et al. |
| 2010/0090731 A1 | 4/2010 | Casagrande et al. |
| 2010/0109714 A1 | 5/2010 | Lindfors et al. |
| 2010/0164761 A1 | 7/2010 | Wan et al. |
| 2010/0194483 A1 | 8/2010 | Storaska et al. |
| 2010/0240323 A1 | 9/2010 | Qiao et al. |
| 2010/0323643 A1 | 12/2010 | Ridgers et al. |
| 2011/0006936 A1 | 1/2011 | Lin et al. |
| 2011/0032013 A1 | 2/2011 | Nelson et al. |
| 2011/0095784 A1 | 4/2011 | Behel et al. |
| 2011/0234204 A1 | 9/2011 | Tamura et al. |
| 2011/0234433 A1 | 9/2011 | Aruga et al. |
| 2011/0285575 A1 | 11/2011 | Landez et al. |
| 2011/0304490 A1 | 12/2011 | Janakiraman |
| 2012/0013406 A1 | 1/2012 | Zhu et al. |
| 2012/0161829 A1 | 6/2012 | Fernald et al. |
| 2012/0200330 A1 | 8/2012 | Kawagoe et al. |
| 2012/0249207 A1 | 10/2012 | Natsume et al. |
| 2012/0262315 A1 | 10/2012 | Kapusta et al. |
| 2012/0293221 A1* | 11/2012 | Ma ................ H03L 7/0812 327/156 |
| 2012/0297231 A1 | 11/2012 | Qawami et al. |
| 2012/0317365 A1 | 12/2012 | Elhamias et al. |
| 2012/0328052 A1 | 12/2012 | Etemadi et al. |
| 2013/0002467 A1 | 1/2013 | Wang |
| 2013/0162454 A1 | 6/2013 | Lin |
| 2013/0194115 A1 | 8/2013 | Wu et al. |
| 2013/0211758 A1 | 8/2013 | Prathapan et al. |
| 2013/0300455 A1 | 11/2013 | Thirugnanam et al. |
| 2014/0021990 A1* | 1/2014 | Na ................ H03L 7/10 327/158 |
| 2014/0029646 A1 | 1/2014 | Foxcroft et al. |
| 2014/0210532 A1 | 7/2014 | Jenkins et al. |
| 2014/0327478 A1 | 11/2014 | Horng et al. |
| 2014/0347941 A1 | 11/2014 | Jose et al. |
| 2015/0028960 A1 | 1/2015 | Yorita |
| 2015/0162921 A1 | 6/2015 | Chen et al. |
| 2015/0180594 A1 | 6/2015 | Chakraborty et al. |
| 2015/0200649 A1 | 7/2015 | Trager et al. |
| 2015/0213873 A1* | 7/2015 | Joo ................ H03L 7/087 365/154 |
| 2016/0013796 A1* | 1/2016 | Choi ................ H03L 7/0802 327/158 |
| 2016/0084895 A1 | 3/2016 | Imhof |
| 2016/0119118 A1 | 4/2016 | Shokrollahi |
| 2016/0162426 A1 | 6/2016 | Benjamin et al. |
| 2016/0211929 A1 | 7/2016 | Holden et al. |

OTHER PUBLICATIONS

"NB3W1200L: 3.3 V 100/133 MHz Differential 1:12 Push-Pull Clock ZDB/Fanout Buffer for PCIe", ON Semiconductor, http://onsemi.com, Aug. 2013, Rev. 0, 26 Pages.

Avramov, et al., "1.5-GHz Voltage Controlled Oscillator with 3% Tuning Bandwidth Using a Two-Pole DSBAR Filter", Ultrasonics, Ferroelectrics and Frequency Control. IEEE Transactions on. vol. 58., May 2011, pp. 916-923.

Hwang, et al., "A Digitally Controlled Phase-Locked Loop with a Digital Ohase-Frequency Detector for Fast Acquisition", IEEE Journal of Solid State Circuits, vol. 36, No. 10, Oct. 2001, pp. 1574-1581.

Kratyuk, et al., "Frequency Detector for Fast Frequency Lock of Digital PLLs", Electronic Letters, vol. 43, No. 1, Jan. 4, 2007, pp. 1-2.

Mansuri, "Fast Frequency Acquisition Phase-Frequency Detectors for GSamples/s Phase-Locked Loops", IEEE Journal of Solid-State Circuits, vol. 37 No. 10, Oct. 2002, pp. 1331-1334.

Nagaraju, "A Low Noise 1.5GHz VCO with a 3.75% Tuning Range Using Coupled FBAR's", IEEE International Ultrasonics Symposium (IUS), Oct. 2012, pp. 1-4.

Natanabe, "An All-Digital PLL for Frequency Multilication by 4 to 1022 with Seven-Cycle Lock Time", IEEE Journal of Solid-State Circuits, vol. 39 No. 2, Feb. 2003, pp. 198-204.

Texas Instruments "CDCEx913 Programmable 1-PLL VCXO Clock Synthesizer With 1.8-V, 2.5-V, and 3.3-V Outputs", Apr. 2015, pp. 1-36, pp. 11, 20-22.

* cited by examiner

FIG. 1

Prior Art

BUFFER WITH PROGRAMMABLE INPUT/OUTPUT PHASE RELATIONSHIP

BACKGROUND

Digital logic circuits often rely on clock signals for synchronization, derivation of reference signals, measuring phase differences, and other functions. The circuits may be segregated into different integrated circuits or different subsystems of a larger electronic device.

One approach for getting the clock signal to all components requiring a clock is to distribute the clock signal from a centralized clock to every component requiring the clock signal. One disadvantage of this approach is that clock signals tend to have constraints that are difficult to maintain when the distribution is over a relatively large area or used to drive a relatively large number of components.

Another technique for distributing a clock signal entails distributing a reference clock signal to different components or even different regions within an integrated circuit. Each component or region has a local phase locked loop (PLL) or local delay locked loop (DLL) buffer to derive one or more local clock signals from the reference clock signal. Such designs are sometimes referred to as a "clock tree". The use of a tree structure allows clocked buffers to be configured for the specifics of the loads they are driving as well as limiting the load to be driven by any clock signal.

Figure 1:
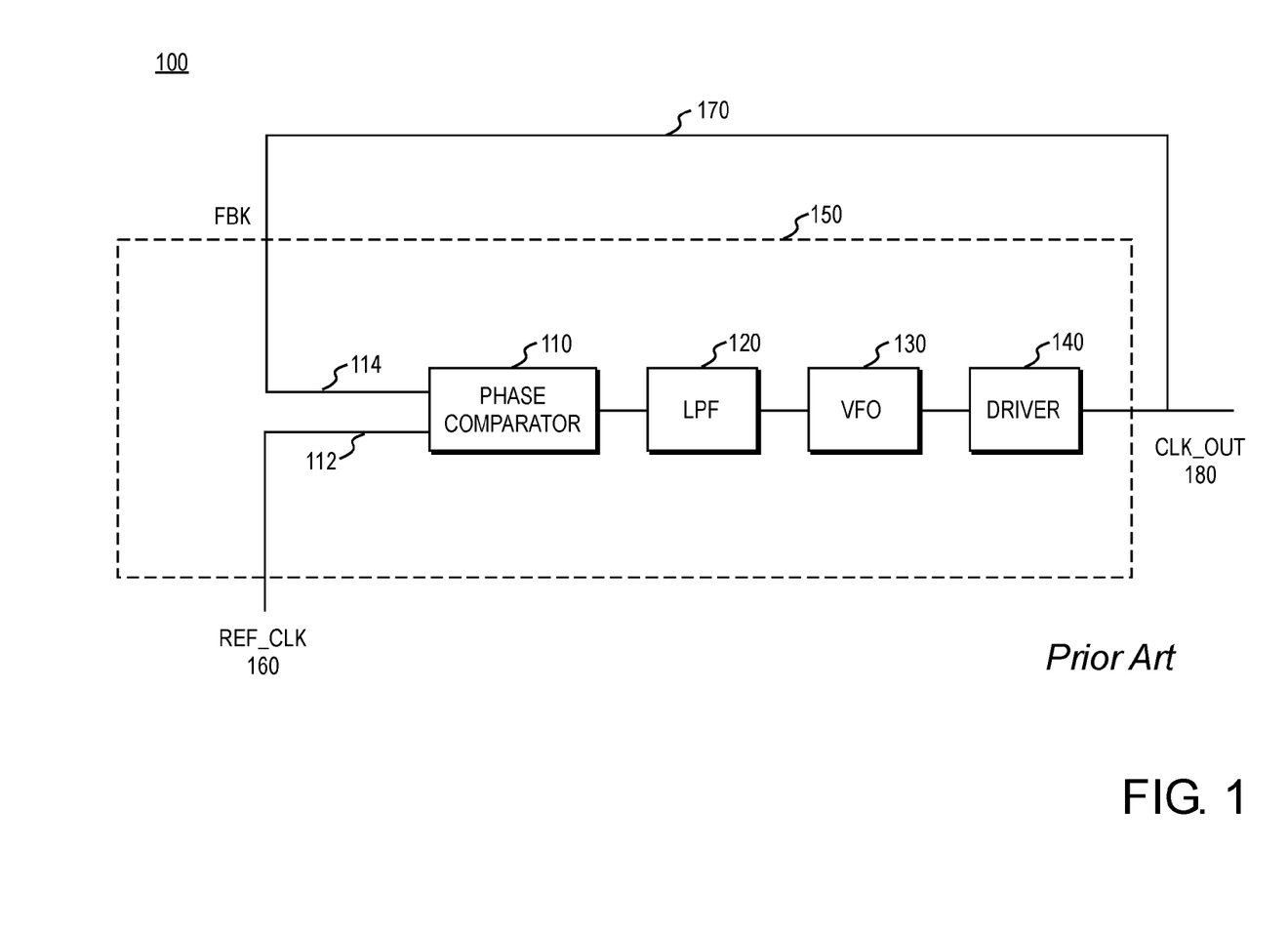
FIG. 1 illustrates a functional block diagram of a prior art phase locked loop circuit.

FIG. 1 illustrates one embodiment of a prior art PLL circuit 100. The reference clock 160 is provided to the reference clock input 112 of a phase comparator 110. The PLL clock output 180 is taken from the output of a variable frequency oscillator (VFO) 130. A feedback loop 170 couples the PLL clock output to a feedback input 114 of the phase comparator. The phase comparator generates a phase error signal which is filtered by a low pass filter (LPF) 120. The filtered phase error signal controls the VFO. The frequency and phase of the VFO varies in response to the filtered phase error signal. Driver 140 receives the output of VFO 130. VFO 130 is driven to cause the PLL clock output to match the phase and frequency of the reference clock. The PLL may be fabricated on a semiconductor substrate 150. Although only the monitored output 180 is shown, the PLL may drive multiple outputs.

A zero phase delay between the PLL clock output and the reference clock is often a design objective. However there are applications in which the designer needs the PLL clock output phase to lead the reference clock. Prior art clock PLL implementations introduce elements into the PLL feedback loop or select the load driven by the monitored output to change the frequency and phase relationship between the reference clock and the derived clock. Changing the amount of phase advance thus requires selecting different components for the PLL feedback loop or adjusting the load of the monitored output in such a prior art architecture.

SUMMARY

An apparatus includes a phase locked loop circuit having a phase detector for generating a signal indicative of a phase difference between a signal presented to a first input of the phase detector and a signal presented to a second input of the phase detector. At least one delay element is disposed so as to contribute at least one of:

i) a delay to a signal provided to the first input of the phase detector;

ii) a delay to a signal provided to the second input of the phase detector.

The delay contributed by the at least one delay element varies in accordance with an associated delay control value. The phase locked loop circuit and the at least one delay element reside on the same semiconductor substrate.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 2:
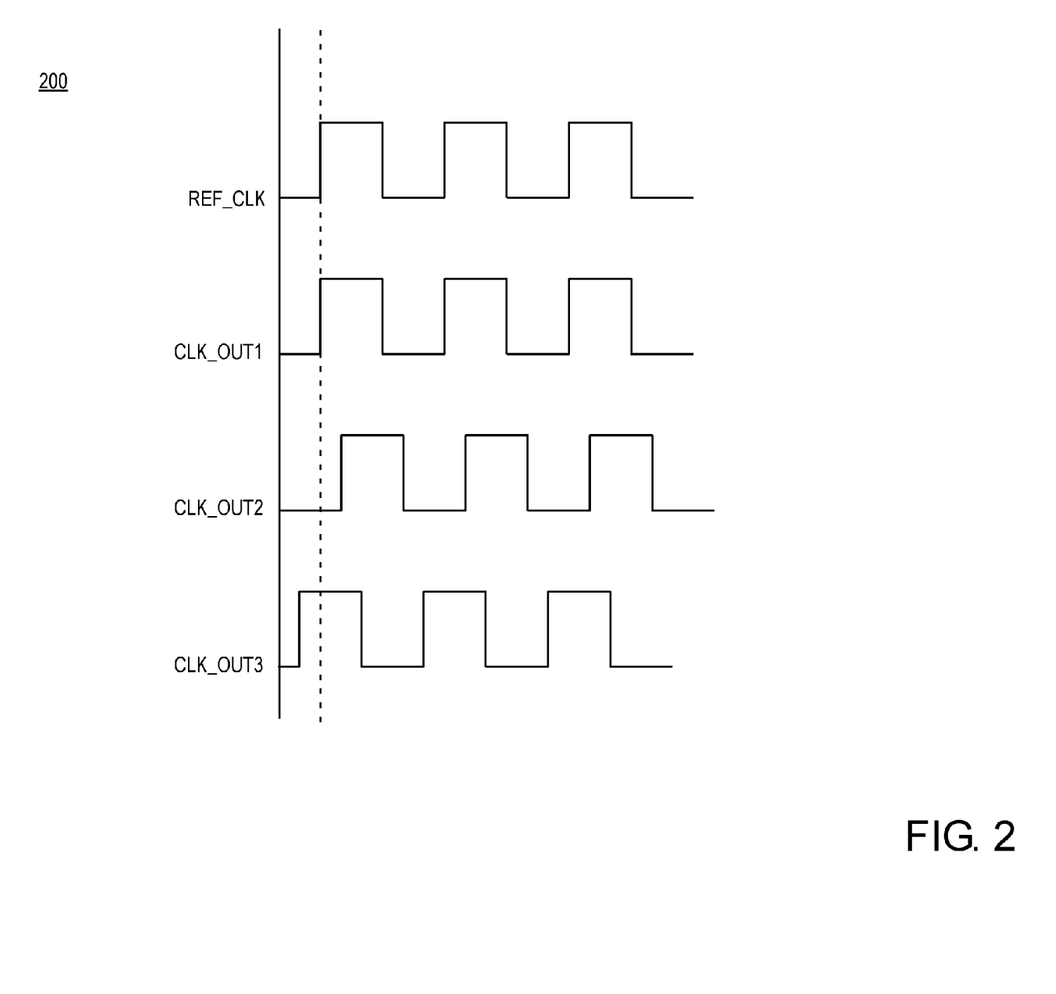
FIG. 2 illustrates clock signals with varying phase relationships compared to a reference clock signal.

Chart 200 of FIG. 2 illustrates clock signals (CLK_OUT1, CLK_OUT2, CLK_OUT3) with varying phase relationships compared to a reference clock signal (REF_CLK).

CLK_OUT1 exhibits a zero phase delay with respect to REF_CLK. CLK_OUT2 exhibits a non-zero phase delay (lagging) with respect to REF_CLK. CLK_OUT3 illustrates a phase advance (leading) with respect to REF_CLK.

Figure 3:
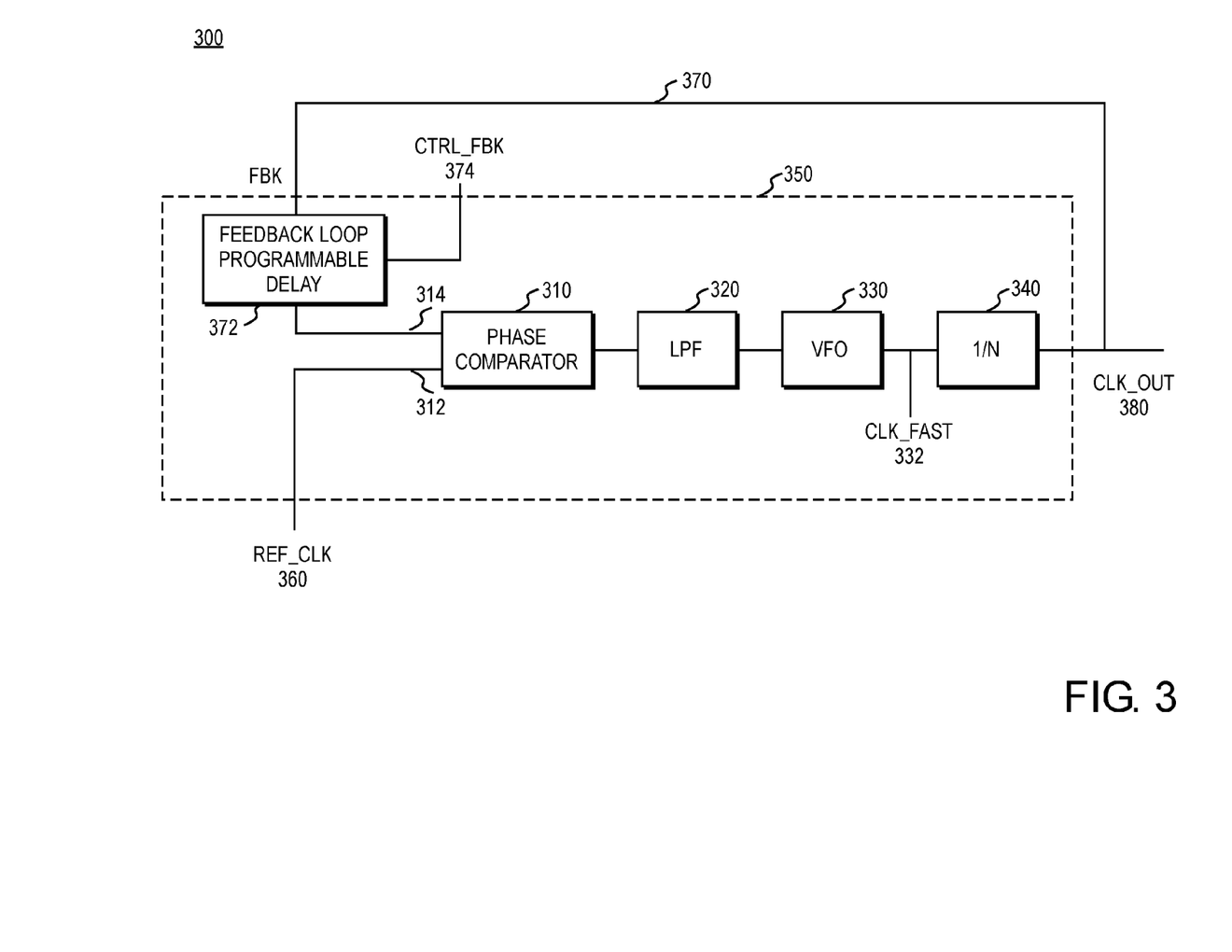
FIG. 3 illustrates one embodiment of a phase locked loop circuit with a programmable delay element in the feedback path.

FIG. 3 illustrates one embodiment of a phase locked loop circuit 300 with a programmable delay element 372 in the feedback path. The reference clock 360 is provided to the reference clock input 312 of a phase comparator 310. The PLL clock output 380 is taken from the output of a variable frequency oscillator (VFO) 330 after it has been divided by divider 340.

A feedback loop 370 couples the PLL clock output to the delay element 372 that is coupled to a feedback input 314 of the phase comparator. The phase comparator generates a phase error signal that is filtered by a low pass filter (LPF) 320. The filtered phase error signal controls the VFO. The frequency and phase of the VFO vary in response to the filtered phase error signal. The VFO is driven to cause the PLL clock output to match the phase and frequency of the reference clock REF_CLK 360. The PLL may be fabricated on a semiconductor substrate 350. Although only the monitored output 380 is shown, the PLL may drive multiple outputs.

The delay element 372 contributes a signal delay based upon a delay control value provided by the CTRL_FBK signal 374. In one embodiment, the delay element 372 is located on the same semiconductor substrate as the other functional blocks of the PLL circuit. CLK_FAST 332 may be utilized as the clock signal for clocking delay element 372 if necessary. In one embodiment delay element 372 includes synchronous logic.

The delay contributed by the delay element in the feedback path causes the PLL to advance the phase of the PLL clock output 380 such that it leads the reference clock 360. The amount of delay is determined by the delay control value provided by CTRL_FBK 374.

Figure 4:
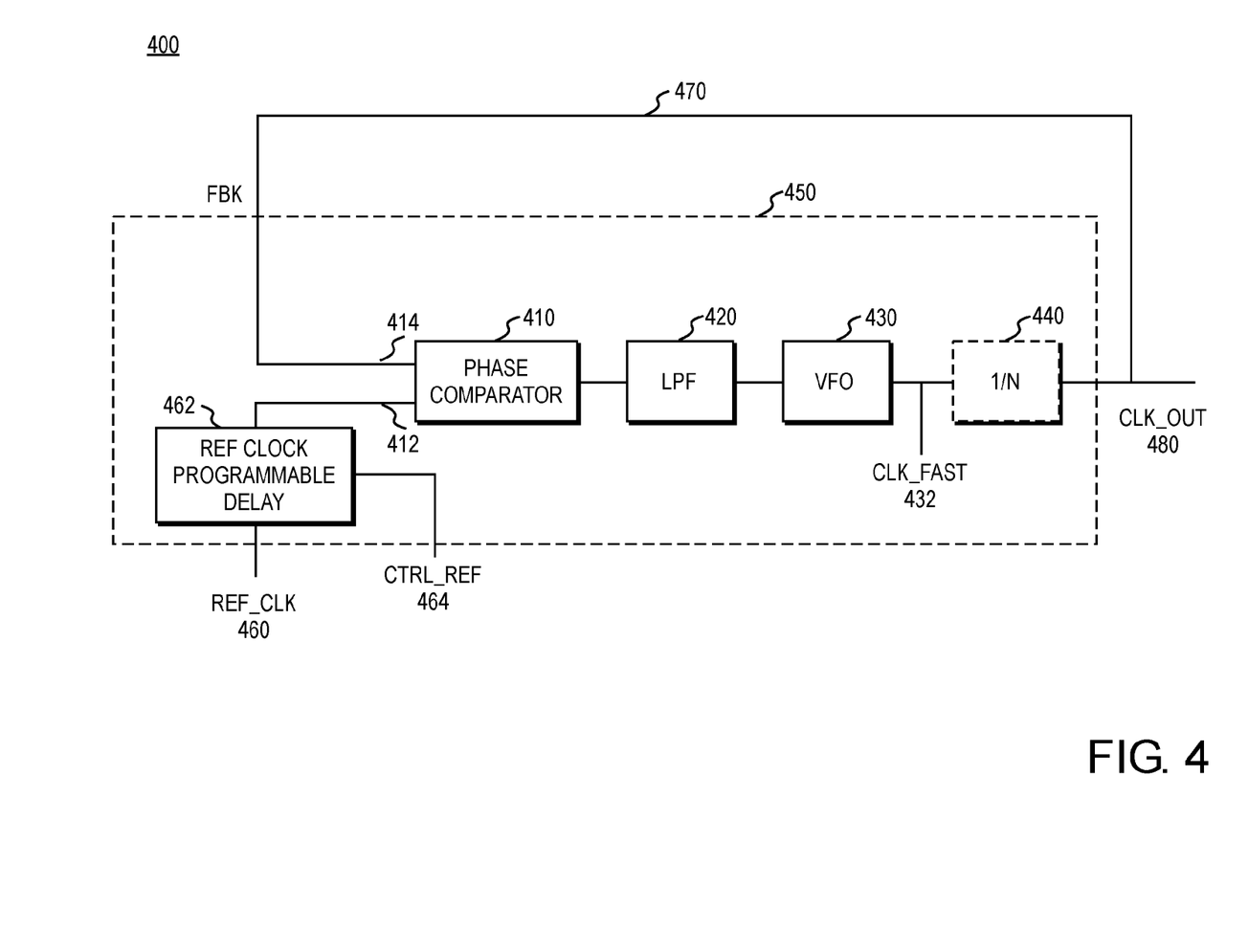
FIG. 4 illustrates one embodiment of a phase locked loop circuit with a programmable delay element in the reference clock path.

FIG. 4 illustrates one embodiment of a phase locked loop circuit 400 with a programmable delay element 462 in the reference clock path. The delay element 462 is coupled to receive the reference clock 460. The output of the delay element is coupled to the reference clock input 412 of a phase comparator 410. The PLL clock output 480 is taken from the output of a variable frequency oscillator (VFO) 430.

A feedback loop 470 couples the PLL clock output to the feedback return input 414 of the phase comparator. The phase comparator generates a phase error signal which is filtered by a low pass filter (LPF) 420. The filtered phase error signal controls the VFO. The frequency and phase of the VFO vary in response to the filtered phase error signal. The VFO is driven to cause the PLL clock output to match the phase and frequency of the reference clock REF_CLK 460. The PLL circuit may be fabricated on a semiconductor substrate 450. Although only the monitored output 480 is shown, the PLL circuit may drive multiple outputs.

Divide-by-N divider 440 is shown as an optional element. If divider 440 is included, the frequency of CLK_FAST 432 at the output of the VFO will be a multiple of the frequency of the PLL clock output 480.

The delay element 462 contributes a signal delay based upon a delay control value provided by the CTRL_REF signal 464. CLK_FAST 432 may be utilized as a clock signal for clocking delay element 462 if necessary. In one embodiment delay element 462 includes synchronous logic. In one embodiment, the delay element 462 is located on the same semiconductor substrate as the other functional blocks of the PLL circuit.

The delay contributed by the delay element in the reference clock path causes the PLL to delay the phase of the PLL clock output 480 such that it lags the reference clock 460. The amount of delay is determined by the delay control value provided by CTRL_REF 464.

Figure 5:
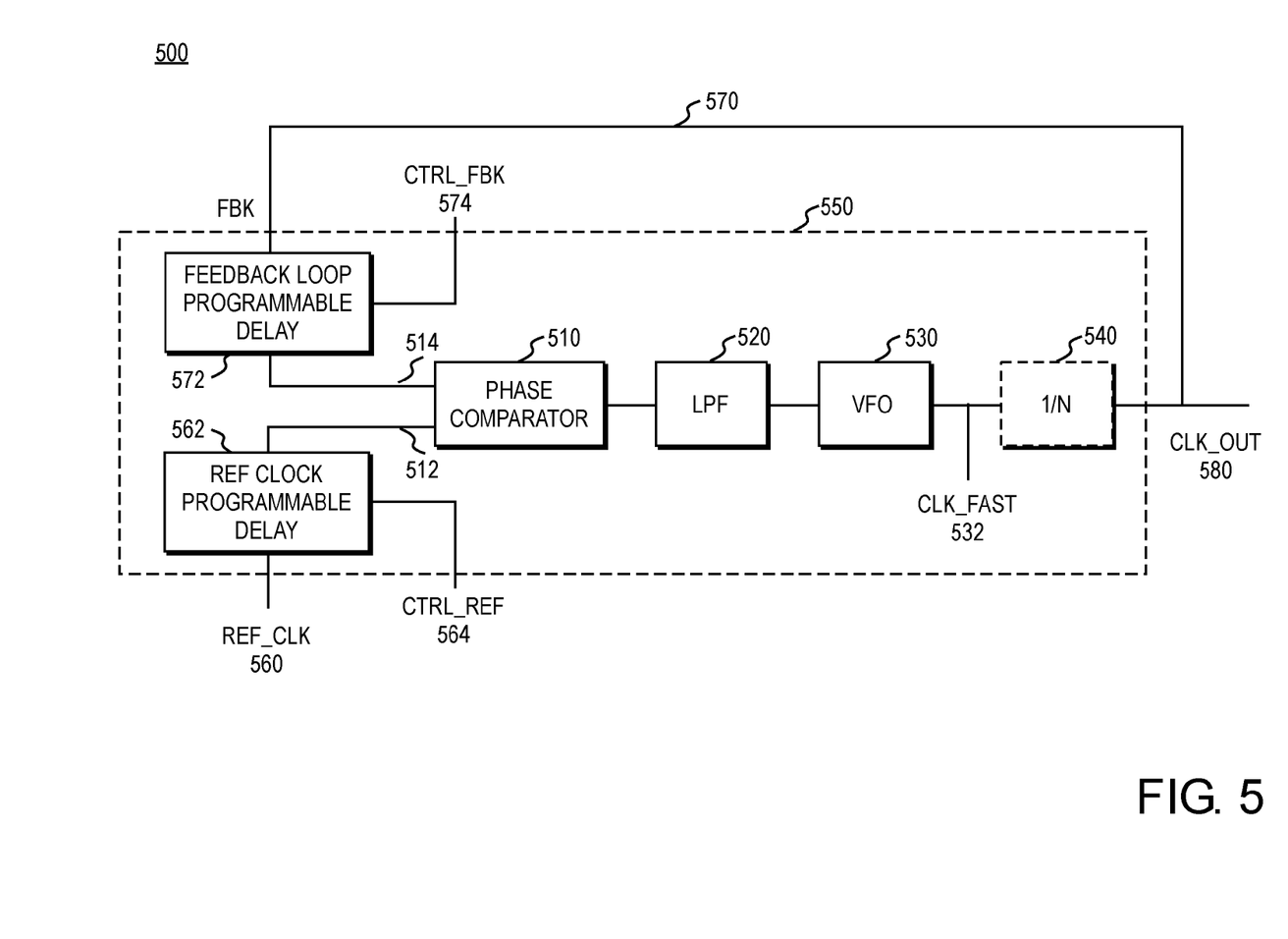
FIG. 5 illustrates one embodiment of a phase locked loop circuit with a programmable delay element in each of the feedback path and the reference path.

The embodiments illustrated in FIGS. 3 and 4 permit only advancing or delaying the PLL clock output phase relative to the reference clock, respectively. FIG. 5 illustrates one embodiment of a phase locked loop circuit 500 with a programmable delay element in each of the feedback path and the reference path to enable both advancing and delaying the PLL clock output 580 relative to the reference clock 560.

The phase locked loop circuit includes a first programmable delay element 572 in the feedback path and a second programmable delay element 562 in the reference clock path. The PLL clock output 580 is taken from the output of a variable frequency oscillator (VFO 530).

A feedback loop 570 couples the PLL clock output to the first delay element 572. The output of the programmable delay element 562 is coupled to the feedback input 514 of the phase comparator 510. The output of the programmable delay element 562 is coupled to the reference clock input 512 of the phase comparator 510. The programmable delay element 562 receives the reference clock 560 as an input.

The phase comparator 510 generates a phase error signal indicating a phase difference between its feedback input 514 and its reference clock input 512. The phase error signal is filtered by low pass filter 520. The filtered phase error signal controls VFO 530. The frequency and phase of VFO 530 vary in response to the filtered phase error signal. The PLL may be fabricated on a semiconductor substrate 550. Although only the monitored output 580 is shown, the PLL may drive multiple outputs.

Divide-by-N divider 540 is shown as an optional element. If divider 540 is included, the frequency of CLK_FAST signal 532 at the output of the VFO will be a multiple of the frequency of the PLL clock output 580.

The delay element 572 contributes a signal delay based upon a delay control value provided by the CTRL_FBK signal 574. In one embodiment, the delay element 572 is located on the same semiconductor substrate as the other functional blocks of the PLL circuit. The delay contributed by the delay element in the feedback path causes the PLL to advance the phase of the PLL clock output 580 such that it leads the reference clock 560. The amount of delay is determined by the delay control value provided by CTRL_FBK signal 574.

The delay element 562 contributes a signal delay based upon a delay control value provided by the CTRL_REF signal 564. In one embodiment, the delay element 562 is located on the same semiconductor substrate as the other functional blocks of the PLL circuit. The delay contributed by the delay element in the reference clock path causes the PLL to delay the phase of the PLL clock output 580 such that it lags the reference clock 560. The amount of delay is determined by the delay control value provided by CTRL_REF 564.

Although delay element 562 operates exclusively to delay the PLL clock output and delay element 572 operates exclusively to advance the PLL clock output, in one application the delay elements are each programmed to contribute a non-zero delay in order to permit greater resolution control of the amount of phase lead or phase lag of the PLL clock output 580.

The delay elements may be introduced in either analog, digital, or mixed signal PLL circuitry. CLK_FAST 532 may be utilized as a clock signal for clocking one or both of delay elements 562, 572 if necessary. In one embodiment one or both of delay elements 562, 572 includes synchronous logic.

Figure 6:
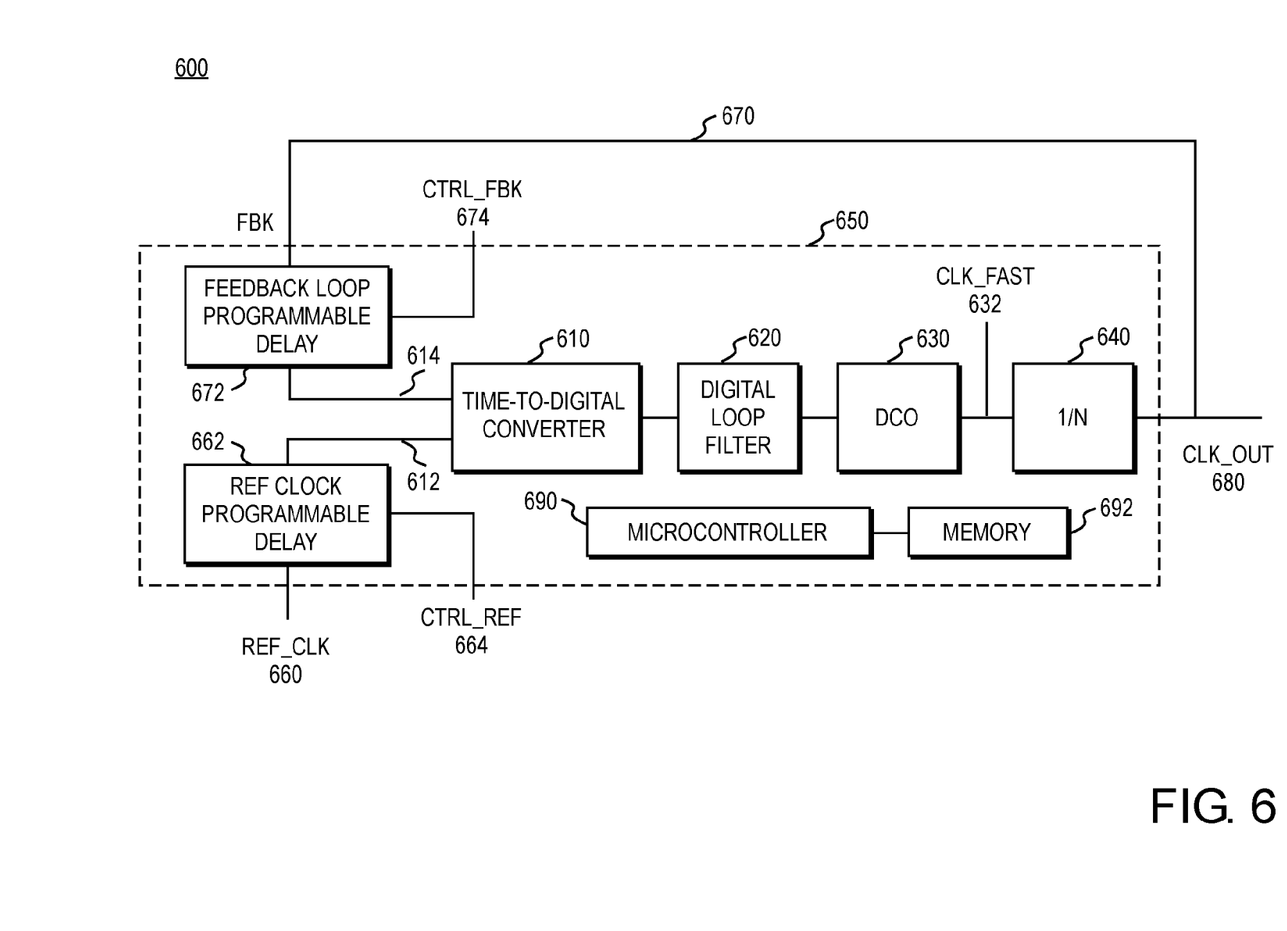
FIG. 6 illustrates one embodiment of an all-digital phase locked loop circuit with a programmable delay element in each of the feedback path and the reference path.

FIG. 6 illustrates one embodiment of a phase locked loop circuit 600 with digitally implemented function blocks and delay elements. The phase locked loop circuit includes a first programmable delay element 672 in the feedback path and a second programmable delay element 662 in the reference clock path. The PLL clock output 680 is taken from the output of a variable frequency oscillator (VFO 630).

A feedback loop FBK 670 couples the PLL clock output to programmable delay element 672. The output of the programmable delay element 672 is coupled to the feedback input 614 of the phase comparator. In this embodiment the phase comparator is implemented as a time-to-digital converter 610. The output of the programmable delay element 662 is coupled to the reference clock input 612 of the time-to-digital converter 610. The programmable delay element receives the reference clock 660 as an input.

The time-to-digital converter 610 generates a detected phase error value or signal indicating a phase difference between its feedback input 614 and its reference clock input 612. The phase error signal is filtered by a digital low pass filter 620. The filtered phase error signal controls the VFO that is implemented as a digitally controlled oscillator (DCO 630). The frequency and phase of the DCO vary in response to the filtered phase error signal. Divide-by-N divider 640 will cause the DCO to be driven to generate an output signal CLK_FAST 632 having a frequency that is a multiple (N) of the frequency of the PLL clock output, CLK_OUT 680. The PLL may be fabricated on a semiconductor substrate 650. Although only the monitored output 680 is shown (i.e., the output providing the feedback signal, FBK), the PLL may drive multiple outputs. Although not expressly illustrated, the digital function blocks will also be coupled to receive the reference clock as the clock for driving synchronous elements.

The delay element 672 contributes a signal delay based upon a delay control value provided by the CTRL_FBK signal 674. In one embodiment, the delay element 672 is located on the same semiconductor substrate as the other functional blocks of the PLL circuit. The delay contributed by the delay element in the feedback path causes the PLL to advance the phase of the PLL clock output 680 such that it leads the reference clock 660. The amount of delay is determined by the delay control value provided by CTRL_FBK 674.

The delay element 662 contributes a signal delay based upon a delay control value provided by the CTRL_REF signal 664. In one embodiment, the delay element 662 is located on the same semiconductor substrate as the other functional blocks of the PLL circuit. The delay contributed by the delay element in the reference clock path causes the PLL to delay the phase of the PLL clock output 680 such that it lags the reference clock 660. The amount of delay is determined by the delay control value provided by CTRL_REF 664.

The all-digital phase locked loop may be referenced as a digital phase locked loop. Although delay element 662 operates exclusively to delay the DPLL clock output and delay element 672 operates exclusively to advance the DPLL clock output, in one application the delay elements are each programmed to contribute a non-zero delay in order to permit greater resolution control of the amount of phase lead or phase lag of the DPLL clock output 680.

Figure 7:
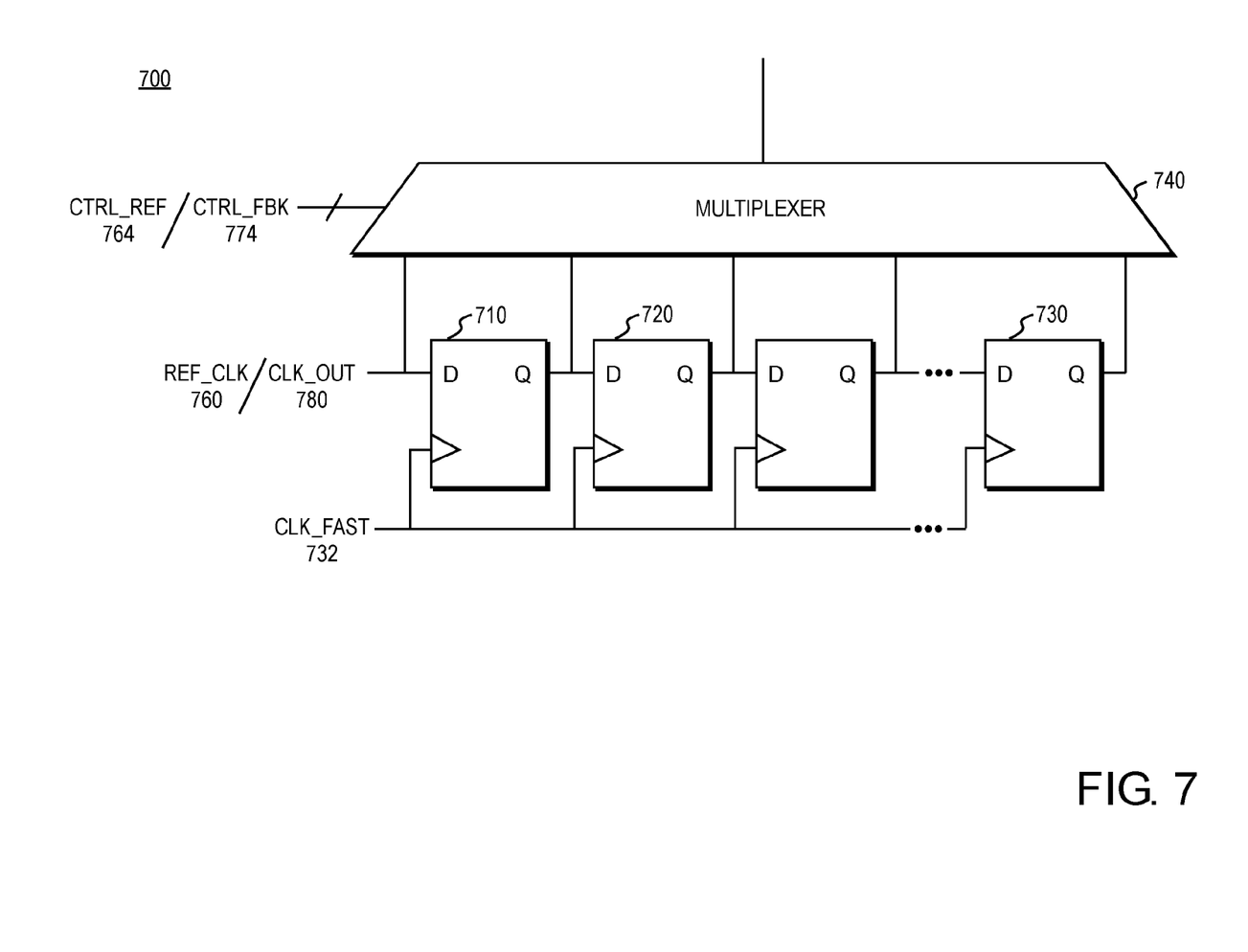
FIG. 7 illustrates one embodiment of a delay element.

The delay elements may be implemented as analog, digital, or mixed-signal circuitry. FIG. 7 illustrates one embodiment of a digital delay element 700.

The digital delay element includes serially coupled D flip-flops 710-730. Flip-flops 710-730 are clocked by the VFO output signal FAST_CLK 732 which corresponds by analogy to the FAST_CLK 632 of FIG. 6.

The first D flip-flop in the series receives the clock signal subject to delay at its "D" input. If the delay element is in the reference clock path then the "D" input is REF_CLK 760 (i.e., analogous to REF_CLK 660 of FIG. 6). If the delay element is in the feedback path then the "D" input is CLK_OUT 780 (i.e., analogous to CLK_OUT 680 of FIG. 6).

The Q output of each flip-flop is provided to the D input of the next flip-flop in the series. The Q outputs of the D flip-flops are also provided to a multiplexer 740. The multiplexer selects one of the Q outputs from the plurality of serially coupled D flip-flops in accordance with a control signal. For a delay element in the reference clock path, the control signal CTRL_REF 764 is analogous to CTRL_REF 664 of FIG. 6. For a delay element in the feedback path, the control signal is CTRL_FBK 774 which is analogous to CTRL_FBK 674 of FIG. 6.

The delay element 700 may be utilized as the delay element for any or both of the reference clock delay element or the feedback path delay element. With reference to FIGS. 3-6, the CTRL_REF or CTRL_FBK signals serve as the multiplexer select signal to determine which tap of the delay line is selected by the multiplexer.

In one embodiment, the phase locked loop circuitry with programmable advance/delay is fabricated on a semiconductor substrate for incorporation into an integrated circuit package. In one embodiment, the integrated circuit package includes a microcontroller to facilitate programmatic control of the phase offset.

"Programmable" or "programmatic control" means that the delay control values can be programmatically set and varied and that the value is not permanently fixed at the time of manufacture. This may be accomplished by storing the delay control values in a register, memory, or other storage location from which the values can be retrieved. In one embodiment, the delay control values are stored in volatile memory. In an alternative embodiment, the delay control values are stored in a non-volatile memory in order to preserve the values across power-down cycles of the apparatus.

Referring to FIG. 6, the microcontroller 690 and memory 692 are illustrated as residing on the same semiconductor substrate 650 as the phase lock loop circuit and delay elements. Circuitry connecting the microcontroller to the delay elements is not expressly illustrated although the microcontroller is coupled to provide either one or both of the CTRL_REF and CTRL_FBK signals as implemented.

Figure 8:
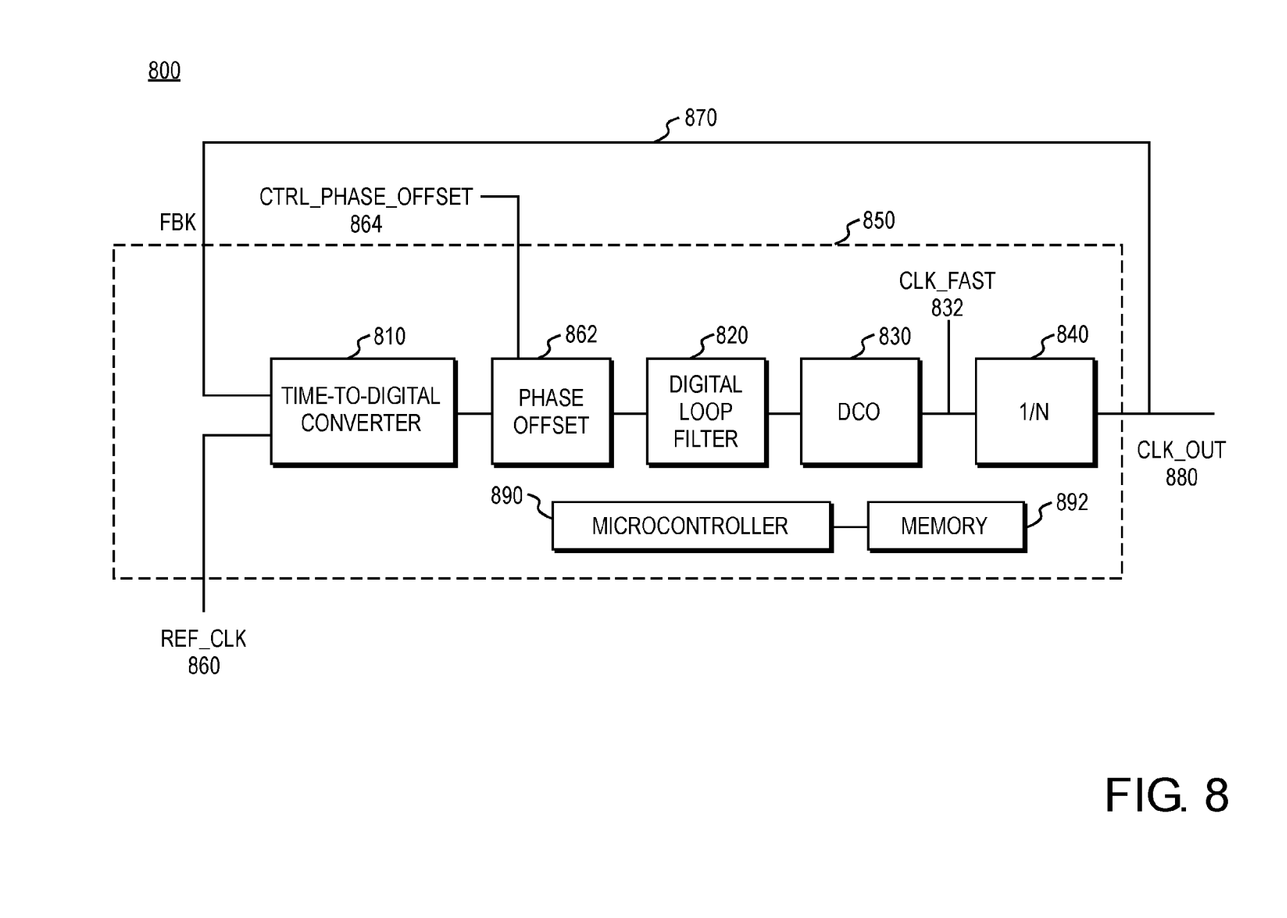
FIG. 8 illustrates an alternative embodiment of a digital phase lock loop with programmable input/output phase relationship

FIG. 8 illustrates an alternative embodiment of a digital phase lock loop 800 with programmable input/output phase relationship. Phase comparison is handled by time-to-digital converter 810. The time-to-digital converter receives the PLL clock output (CLK_OUT 880) and the reference clock (REF_CLK 860). The time-to-digital converter generates a digital code indicative of the measured phase error between CLK_OUT and REF_CLK. The time delay between receipt of selected edges of the REF_CLK and CLK_OUT signals corresponds to phase error.

The time delay or phase error may be determined by counting the number of cycles of a higher frequency clock that occur within a window bound by a leading edge of REF_CLK and the leading edge of CLK_OUT, for example. The count corresponds to the phase error. In one embodiment, the time-to-digital converter is configured to express the count as a unary or thermometer coded value. The output of time-to-digital converter 810 is thus the measured phase error expressed as a thermometer coded value.

The output of the time-to-digital converter is provided to phase offset block 862. Phase offset block 862 modifies the measured phase error in accordance with a phase offset control signal, CTRL_PHASE_OFFSET 864. In one embodiment, the phase offset block is a shift register.

The modified phase error value is provided to the digital loop filter 820. In one embodiment, the digital loop filter is a low pass filter. The output of the digital loop filter is provided to digitally controlled oscillator, DCO 830. The output of DCO 830 is provided to the divide-by-N divider 840. Divider 840 will cause the DCO to be driven to generate an output signal CLK_FAST 832 having a frequency that is a multiple (N) of the frequency of the PLL clock output, CLK_OUT 880. The DCO is driven to cause the frequency of the PLL clock output, CLK_OUT 880, to match the frequency of the reference clock REF_CLK 860. The phase of CLK_OUT will match the phase of REF_CLK offset by an offset determined by CTRL_PHASE_OFFSET. The PLL may be fabricated on a semiconductor substrate 850. Although only the monitored output 880 is shown, the PLL may drive multiple outputs.

The embodiment of FIG. 8 eliminates delay elements in the reference clock path and the feedback path. With reference to FIG. 6, for example, delay elements 662, 672 are not needed. Instead of placing delay elements at one or more inputs of the phase comparator to alter the input/output phase relationship, the amount of phase lead or lag is controlled by directly modifying the measured or detected phase error. In one embodiment, the phase offset block modifies the measured phase error by shifting a thermometer coded value left or right—shifting in "1" or "0" as appropriate for a thermometer code. For example, given a value of "0011", the phase offset block can cause additional lag by shifting the given value to the right, i.e., "0001". The phase offset block can advance CLK_OUT by shifting the value to the left, i.e., "0111". The phase offset block can control the amount of lead or lag with greater timing resolution as the number of bits of the thermometer code increases.

In one embodiment, the phase locked loop circuitry with programmable advance/delay is fabricated on a semiconductor substrate 850 for incorporation into an integrated circuit package. A microcontroller 890 and memory 892 are illustrated as residing on the same semiconductor substrate 850 with the remainder of the phase locked loop circuitry. Circuitry connecting the microcontroller to other elements of the phase locked loop circuit is not expressly illustrated although the microcontroller is coupled to enable programmatic control of phase locked loop circuitry. For example, the microcontroller may programmatically regulate CTRL_PHASE_OFFSET signal.

Figure 9:
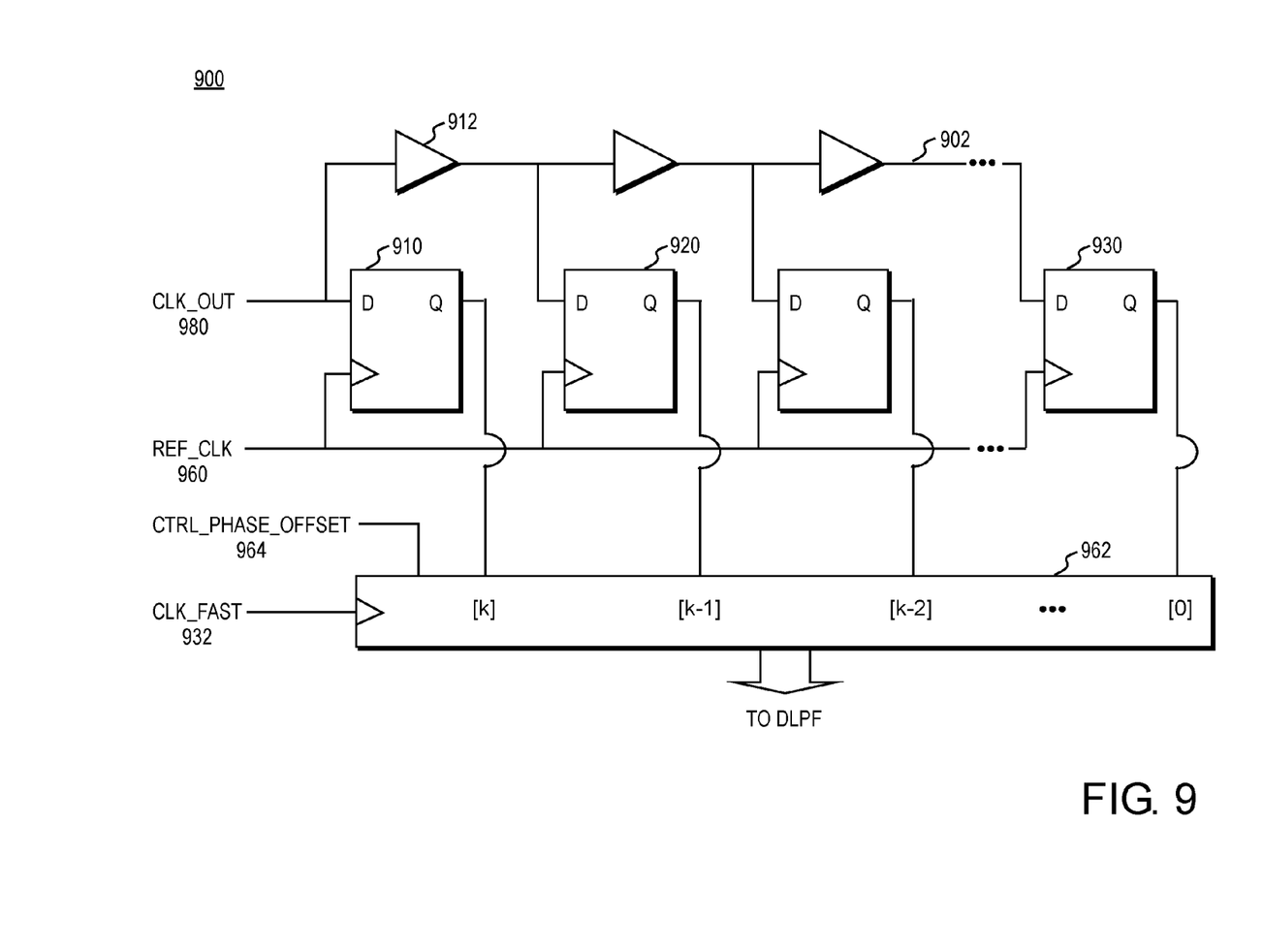
FIG. 9 illustrates one embodiment of a time-to-digital converter and phase offset block corresponding respectively to the time-to-digital converter and phase offset block of FIG. 8.

FIG. 9 illustrates one embodiment 900 of a time-to-digital converter and phase offset block corresponding respectively to elements 810 and 862 of FIG. 8. The time-to-digital converter includes a delay line 902 with a plurality of buffers 912 each of which contributes a small amount of delay to a signal propagating along the delay line. A plurality of "D" flip-flops 910-930 is coupled to the delay line such that the D input of each successive flip-flop taps the output of a successive buffer of the delay line. The input to the delay line is CLK_OUT 980. Referring to FIG. 8, CLK_OUT is presented to the input of the time-to-delay converter 810 by FBK signal 870. The clock for the plurality of flip-flops is REF_CLK 960 which corresponds to REF_CLK 860 of FIG. 8.

The phase offset block 862 of FIG. 8 is implemented as a parallel shift register 962 in FIG. 9. The parallel shift register (i.e., phase offset block) receives a measured phase error value from the plurality of flip-flops. The measured phase error value in the illustrated embodiment is a thermometer coded value with [k] as the most significant bit and [0] as the least significant bit. CTRL_PHASE_OFFSET 964 controls the direction and number of bit positions the received thermometer coded value is shifted. The parallel shift register 962 is clocked by CLK_FAST 932 which corresponds to CLK_FAST 832 of FIG. 8. In an alternative embodiment, the parallel shift register may be clocked by REF_CLK 860. The output of the phase offset block is provided to the digital low pass filter.

Figure 10:
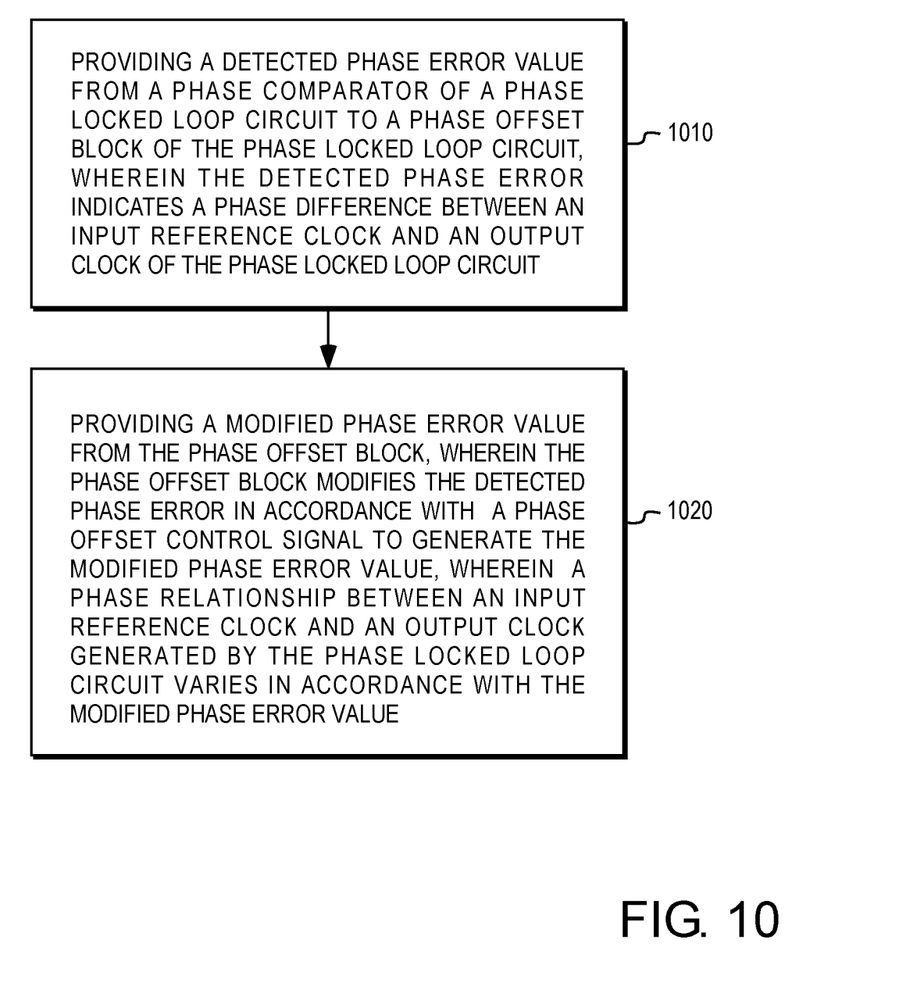
FIG. 10 illustrates one embodiment of a method of controlling the input/output phase relationship of a phase-locked loop circuit.

FIG. 10 illustrates one embodiment of a method of controlling the input/output phase relationship of a phase-locked loop circuit. A phase comparator of a phase locked loop circuit provides a detected phase error value to a phase offset block of the phase locked loop circuit in step 1010. The detected phase error indicates a phase difference between an input reference clock and an output clock of the phase locked loop circuit.

In step 1020, the phase offset block provides a modified phase error value. The phase offset block modifies the detected phase error in accordance with a phase offset control to generate the modified phase error value. A phase relationship between the input reference clock to the phase locked loop circuit and an output clock generated by the phase locked loop circuit varies in accordance with the modified phase error value.

In the preceding detailed description, the invention is described with reference to specific exemplary embodiments thereof. Various modifications and changes may be made thereto without departing from the broader scope of the invention as set forth in the claims. The specification and drawings are, accordingly, to be regarded in an illustrative rather than a restrictive sense.

What is claimed is:

1. An apparatus comprising:
a phase locked loop circuit including a phase comparator for generating a signal indicative of a phase difference between a signal presented to a first input of the phase comparator and a signal presented to a second input of the phase comparator;
a first delay element for contributing delay to the signal provided to the first input of the phase comparator;
a second delay element for contributing delay to the signal provided to the second input of the phase comparator, wherein a delay contributed by at least one of the first delay element and the second delay element varies in accordance with an associated delay control value; and
a microcontroller coupled to the first delay element and to the second delay element, wherein the microcontroller generates the associated delay control value, wherein the phase locked loop circuit, the first delay element, the second delay element and the microcontroller reside on a same semiconductor substrate.

2. The apparatus of claim 1 wherein the first delay element contributes an analog delay corresponding to the associated delay control value.

3. The apparatus of claim 1 wherein the first delay element contributes a fixed delay corresponding to its associated delay control value.

4. The apparatus of claim 1 further comprising:
a nonvolatile memory for storing the associated delay control value, wherein the nonvolatile memory resides on the same semiconductor substrate.

5. The apparatus of claim 1 wherein the first delay element is a programmable delay element that receives the associated delay control value as a digital signal.

6. The apparatus of claim 5 wherein the first delay element contributes an analog delay corresponding to the associated delay control value.

7. An apparatus comprising:
a phase locked loop circuit including a phase comparator for generating a signal indicative of a phase difference between a signal presented to a first input of the phase comparator and a signal presented to a second input of the phase comparator;
at least one delay element disposed so as to enable contributing delay to the signal provided to the first input of the phase comparator and delay to the signal provided to the second input of the phase comparator, the at least one delay element including a first delay element coupling the first input of the phase comparator to a feedback loop of the phase locked loop circuit, wherein a delay contributed by the first delay element varies in accordance with an associated delay control value; and a microcontroller residing on the same semiconductor substrate as the phase locked loop circuit and the at least one delay element, wherein the microcontroller generates the associated delay control value.

8. The apparatus of claim 7 wherein the first delay element receives the associated delay control value as a digital signal.

9. The apparatus of claim 8 wherein the first delay element contributes an analog delay corresponding to the associated delay control value.

10. An apparatus comprising:

a phase locked loop circuit including a phase comparator for generating a signal indicative of a phase difference between a signal presented to a first input of the phase comparator and a signal presented to a second input of the phase comparator, wherein the phase comparator comprises a time-to-digital converter;

a first delay element coupling the first input of the phase comparator to a feedback loop of the phase locked loop circuit, wherein a delay contributed by the first delay element varies in accordance with a first delay control value; and a second delay element coupled to contribute a delay to the signal provided to the second input of the phase comparator, wherein the delay contributed by the second delay element varies in accordance with a second delay control value, and wherein the first delay element, the second delay element and the phase locked loop circuit reside on a semiconductor substrate.

11. The apparatus of claim 10 further comprising:

a microcontroller residing on the same semiconductor substrate, wherein the microcontroller generates the first delay control value and the second delay control value; and a nonvolatile memory for storing the first delay control value and the second delay control value, wherein the nonvolatile memory resides on the semiconductor substrate.

12. A method of controlling an input/output phase relationship of a phase locked loop circuit comprising the steps of:

receiving an output clock signal of a phase locked loop at a first programmable delay element, the first programmable delay element enabled for contributing delay to the output clock signal to generate a signal provided to a first input of a phase comparator;

receiving an input reference clock signal at a second programmable delay element, the second programmable delay element disposed so as to enable contributing delay to the input reference clock signal to generate a signal provided to a second input of the phase comparator;

comparing the signal provided to a first input of a phase comparator to the signal provided to a second input of a phase comparator to identify a phase error signal, wherein the phase comparator is a time-to-digital converter;

filtering the phase error signal to generate a filtered phase error signal;

generating a fast clock signal at a digitally controlled oscillator using the filtered phase error signal; and dividing the fast clock signal to generate the output clock signal.

13. The method of claim 12 wherein the phase error signal comprises a detected phase error value.

* * * * *